United States Patent
Jones et al.

(10) Patent No.: US 6,862,557 B2
(45) Date of Patent: Mar. 1, 2005

(54) SYSTEM AND METHOD FOR ELECTRONICALLY COLLECTING DATA IN A FABRICATION FACILITY

(75) Inventors: Ronald A. Jones, Tracy, CA (US); Jeffrey Longacre, Sparks, NV (US)

(73) Assignee: Lam Research Corporation, Fremont, CA (US)

( * ) Notice: Subject to any disclaimer, the term of this patent is extended or adjusted under 35 U.S.C. 154(b) by 27 days.

(21) Appl. No.: 10/460,915

(22) Filed: Jun. 12, 2003

(65) Prior Publication Data

US 2004/0255024 A1 Dec. 16, 2004

(51) Int. Cl.[7] .............................................. G06F 17/40
(52) U.S. Cl. ...................................... 702/187; 702/188
(58) Field of Search ................. 700/121; 702/187–190; 709/201, 204–205, 244, 400; 719/319

(56) References Cited

U.S. PATENT DOCUMENTS 6,721,618 B2 * 4/2004 Baek et al. ................. 700/121

OTHER PUBLICATIONS

"Snoop Server," searchSecurity.com Definitions, web page printed on Mar. 14, 2003, p.1, located at http://searchsecurity.techtarget.com/sDefinition/0,sid14_gci773799,00.html.

"SECS/GEM Introduction," web page printed on Mar. 13, 2003, pp. 1–4, located at http://www.cimetrix.com/gem-intromain.html.

* cited by examiner

*Primary Examiner*—Evan Pert
(74) *Attorney, Agent, or Firm*—Carr & Ferrell LLP

(57) ABSTRACT

The present invention is a system for electronically collecting data in a process line in a semiconductor or data storage fabrication facility. The system includes a data collection processing unit configured to sniff data packets transmitted over a LAN between a plurality of tools in the fabrication facility. The data collection processing unit is further configured to determine if the sniffed data packets are valid data packets based on a configuration file established for the plurality of tools. The data collection processing unit is further configured to parse one or more data fragments from the valid data packets.

29 Claims, 6 Drawing Sheets

FIG. 5A

| SECS Data (Tool A) 503 | Parsed, Sniffed Data (Tool A) 505 |
|---|---|
| Process Tool A | Module A Recipe: ECD Barrier |
| Line 4, Bay 3 | Module A Temp: 400°C |
| Shift 2 | Module A Vac: 4E-9 mTORR |
| Start Time: 19:24:05 | Module A Recipe Time: 92 SEC |
| Recipe: Metal 1 | Module A Gas Flow: 3.2 LPM |
| 300 mm ASIC | Module B Recipe: ECD Clean |
| Module A | Module B Temp: 100°C |
| Module B | Module B Vac: 1E-7 mTORR |
| Module C | Module B Recipe Time: 152 SEC |
| Module D | Module B Gas Flow: 6.2 LPM |
|  | Module C Recipe: ECD Seed |
|  | Module C Temp: 350°C |
|  | Module C Vac: 4E-9 mTORR |
|  | Module C Recipe Time: 230 SEC |
|  | Module C Gas Flow 1: 5.2 LPM |
|  | Module C Gas Flow 2: 8.1 LPM |
|  | Module C Gas Flow 3: 1.3 LPM |
|  | Module D Recipe: ECD Fill |
|  | Module D Temp: 300°C |
|  | Module D Vac: 4E-9 mTORR |
|  | Module D Recipe Time: 15 SEC |
|  | Module D Gas Flow: 3.2 LPM |

501

FIG. 5B

Merged SECS and Sniffed Data (Tool A)

Process Tool A
    Line 4, Bay 3
    Shift 2
    Start Time: 19:24:05
    Recipe: Metal 1
    300 mm ASIC
    Module A
        Module A Recipe: ECD Barrier
        Module A Temp: 400°C
        Module A Vac: 4E-9 mTORR
        Module A Recipe Time: 92 Sec
        Module A Gas Flow: 3.2 LPM
    Module B
        Module B Recipe: ECD Clean
        Module B Temp: 100°C
        Module B Vac: 1E-7 mTORR
        Module B Recipe Time: 152 Sec
        Module B Gas Flow: 6.2 LPM
    Module C
        Module C Recipe: ECD Seed
        Module C Temp: 350°C
        Module C Vac: 4E-9 mTORR
        Module C Recipe Time: 230 Sec
        Module C Gas Flow 1: 5.2 LPM
        Module C Gas Flow 2: 8.1 LPM
        Module C Gas Flow 3: 1.3 LPM
    Module D
        Module D Recipe: ECD Fill
        Module D Temp: 300°C
        Module D Vac: 4E-9 mTORR
        Module D Recipe Time: 15 Sec
        Module D Gas Flow: 3.2 LPM

507

SYSTEM AND METHOD FOR ELECTRONICALLY COLLECTING DATA IN A FABRICATION FACILITY

BACKGROUND OF THE INVENTION

1. Field of the Invention

The present invention generally relates to collecting data generated by equipment used for processing substrates used in semiconductor, data storage, and allied industries. More particularly, the present invention relates to electronically collecting data from a Semiconductor Equipment Communications Standard (SECS) data port and electronically sniffing data packets from various pieces of equipment in a semiconductor, data storage, or allied industry fabrication ("fab") facility.

2. Description of the Background Art

The semiconductor, data storage, and allied industries feature manufacturing lines that are rich in data production. Most pieces of process or metrology equipment ("tools") have a myriad of both generated and stored data. The data may include process conditions within a tool (e.g., process duration, process temperature, process gas flows, etc.), operating conditions of the tool (e.g., alarm states, input/output (I/O) signal traces, vacuum and pressure levels, etc.), or general historical data for the tool (e.g., last preventive maintenance (PM), next PM date, overall uptime, etc.). Tool data may also include various substrate feature measurements such as film thickness mapping, resistivity mapping, particle mapping, die-to-database correlations, step height values, line-width measurements, and so on. Data are typically available from both in-situ and ex-situ tools.

In the semiconductor industry, a fab tool is a piece of semiconductor fabrication equipment designed to process wafers (e.g., an ion implanter, a photolithographic stepper, a chemical vapor deposition system, etc.) or a piece of inspection equipment designed to measure or inspect wafers (e.g., a scanning surface inspection system, a critical-dimension scanning electron microscope, a spectroscopic ellipsometer, etc.). Frequently, a specialized fab tool, called a cluster tool, is also used in advanced fabrication facilities. A cluster tool is an integrated, environmentally isolated tool consisting of process, transport, and cassette modules mechanically linked together. A cluster tool module is an element of a cluster tool that performs particular functions, typically dedicated to a given process or portion of a process. A cluster tool module may also contain other modules.

Typically, there is at least one communication interface used to access data from various tools, the Semiconductor Equipment Communications Standard (SECS) protocol. SECS in one of many international consensus-based standards produced by SEMI (Semiconductor Equipment and Materials International), headquartered in San Jose, Calif. The SECS protocol communicates actively via a tool's serial port. Data available from a SECS protocol provides tool and material information such as wafer information, wafer lot number, cassette slot number being processed, recipe name, and process parameters.

A process or line engineer can use or analyze data from a tool to evaluate processing trends, view run-rules for a given process, or perform complex statistical calculations. However, to date, this type of analysis has been limited to a particular tool or a limited set of data available from a plurality of tools.

Statistical techniques are a type of data analysis for controlling a process that is well known in the semiconductor, data storage, and allied industries. For example, statistical process control has been defined as "the use of statistical methods to analyze a process or its output to take appropriate actions to achieve and maintain a state of statistical control and continuously improve the process capability" (SEMATECH Dictionary,). Appropriate actions may include monitoring or changing gas flows, temperatures, ramp rates, or the like. Other statistical techniques include using Shewhart charts (e.g., charting a group mean versus standard deviation) for evaluating run-rules according to the well-known Western Electric sensitizing rules published in 1956.

However, beyond the basic data provided via a SECS port, the ability to collect real-time data from tools has been limited. Many tools today are connected to a local area network (LAN) but currently available methods of extracting data from a tool over a LAN involve installing custom or proprietary software on the tool, sending data requests to a processor controlling the tool, waiting for acknowledgment of data requests from the tool's processor, preparing the data for spooling or streaming, and then collecting the data. This data collection scheme adds computational and timing overhead to the tool's processor in addition to added complexities and expenditures due to the custom or proprietary software.

What is needed in the art is an improved means to obtain more and/or better data from a plurality of tools without affecting existing tool or fab installations.

SUMMARY OF THE INVENTION

The present invention is a system for electronically collecting data in a process line in a semiconductor or data storage fabrication facility. The system includes a data collection processing unit configured to sniff data packets transmitted over a LAN between a plurality of tools in the fabrication facility. The data collection processing unit is further configured to determine if the sniffed data packets are valid data packets based on a configuration file established for the plurality of tools. The data collection processing unit is further configured to parse one or more data fragments from the valid data packets.

The present invention is also a method for electronically collecting data from a tool in a semiconductor or data storage fabrication facility. The method includes sniffing data packets transmitted over a LAN by a plurality of tools located in the fabrication facility, determining if the sniffed data packets are valid data packets, and parsing one or more data fragments from the valid data packets.

BRIEF DESCRIPTION OF THE FIGURES

FIG. 5A is a diagram showing exemplary tabular data received from the SECS interface and parsed data sniffed over the LAN; and FIG. 5B is a diagram showing an exemplary embodiment of a unified data record produced by merging SECS data and parsed data.

DESCRIPTION OF PREFERRED EMBODIMENTS

An electronic data collection system of the present invention collects data from one or more of a variety of tools found in a semiconductor, data storage, or allied industry fabrication facility ("fab"). The present invention is a system and method for collecting operational, event, alarm, and related data from a tool's central processing unit (CPU) and/or module CPUs used for controlling the tools. Data are collected either via a SECS interface and a local-area network (LAN) interface, or both. Collected data may then be distributed to a larger network (e.g., a wide-area network (WAN)) for storage, display, analysis, etc.

Figure 1:
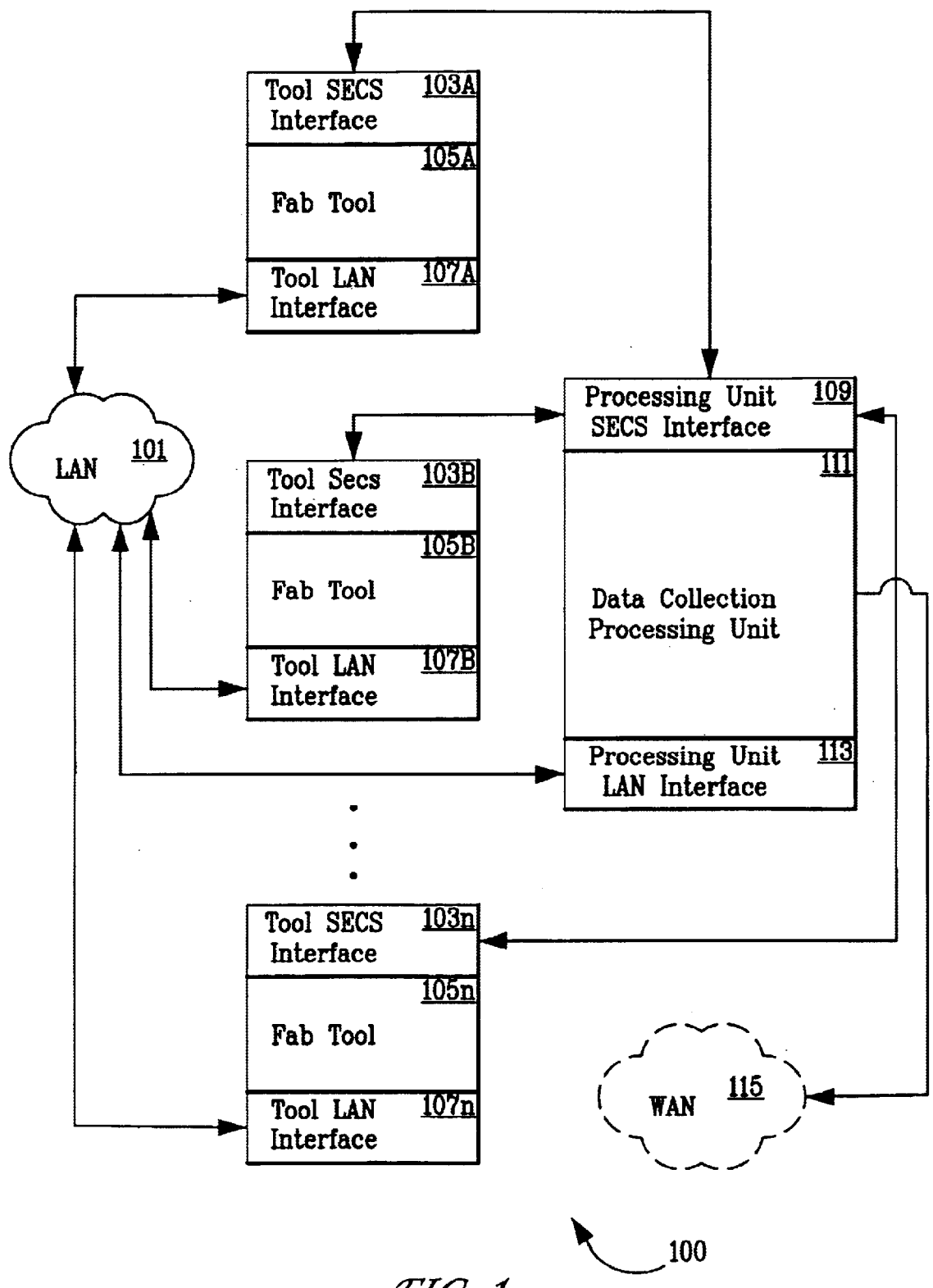
FIG. 1 is an exemplary overview diagram of an embodiment of the present invention for electronically collecting data through a SECS interface and a LAN interface.

FIG. 1 is an exemplary embodiment of the present invention for electronically collecting tool data through a SECS interface and/or a LAN interface. The exemplary embodiment is shown in the context of a fab environment 100. The fab environment 100 includes a LAN 101 and a plurality of fab tools 105A-n. Each of the plurality of fab tools 105A-n has an associated tool SECS interface 103A-n and a tool LAN interface 107A-n. The FIG. 1 embodiment includes a data collection processing unit 111 and, in some embodiments, a WAN 115. In some embodiments, the data collection processing unit 111 has a processing unit SECS interface 109 and a processing unit LAN interface 113.

The LAN 101 is part of a communications network within the fabrication facility. In one exemplary embodiment, the LAN 101 allows for communications to occur using Ethernet packets transmitted between the plurality of fab tools 105A-n.

As discussed above, the plurality of fab tools 105A-n may be any instrument, machine, or device used to perform a task or measure a characteristic or quality of a substrate or the like. Any of the plurality of fab tools 105A-n may be a cluster tool.

The tool SECS interface 103A-n is a physical communications port (e.g., an RS-232 serial port) running a particular communications protocol standard. The SECS protocol standard defines details for the electronic transmission of messages between the plurality of fab tools 105A-n and the data collection processing unit 111. The tool SECS interface 103A-n allows a limited set of data relevant to the fab tool 105A-n to be transmitted electronically.

The processing unit SECS interface 109 may comprise a plurality of SECS ports and communicates with the plurality of fab tools 105A-n utilizing the SECS protocol through the tool SECS interface 103A-n. Alternatively, the SECS interface 109 may be a multiplexed port having an appropriate multiplexing device.

Data pertaining to the fab tool 105A-n are made available for the data collection processing unit 111 via SECS protocol communications between the processing unit SECS interface 109 and the tool SECS interface 103A-n. Such data includes, for example, the fab tool 105A-n identifier, a module identifier, wafer information, wafer lot number, cassette slot number being processed, recipe name, and process parameters.

Frequently, fab tools 105A-n are also connected to the LAN 101 through a network interface card. The network interface card may be, for example, the tool LAN interface 107A-n. Typically, a tool will have one or more CPUs for controlling various tool functions (see FIG. 2). Each of the CPUs will be coupled to communicate electronically via the LAN 101.

The tool LAN interface 107A-n allows the fab tool 105A-n to communicate via the LAN 101. While in communication via the LAN 101, any of the plurality of fab tools 105A-n, or central processing units located within the plurality of fab tools 105A-n (see FIG. 2), are capable of communicating with any other fab tool 105A-n.

The data collection processing unit 111 is able to collect data from one or more of the fab tools 105A-n through the processing unit SECS interface 109 and/or the processing unit LAN interface 113. The communication and data collection process will be discussed in more detail below. Physically, the data collection processing unit 111 may be, for example, a personal computer, workstation, or network server.

In one embodiment of the present invention, the data collection processing unit 111 passively monitors data transmitted within the fab tool 105A-n as well between the plurality of fab tools 105A-n. Passive monitoring occurs by sniffing tool network traffic on the LAN (sniffing is also referred to as "snooping"). Sniffing is passive in that neither a request for data nor an acknowledgment of receipt of data is given. The CPUs (see FIG. 2) within fab tools 105A-n do not need to be aware that any information is gleaned from network traffic by the data collection processing unit 111. For example, a function for sniffing may be embedded in a network analyzer or in data collection processing unit 111 in order to sniff and decode any relevant data packets. Once relevant packets are detected, the packets are parsed and interpreted (see FIGS. 3 and 4) based on knowledge of the tool data format. Sniffing tool network traffic eliminates the need for custom or proprietary software loaded onto a tool and does not interfere with critical timing or add to the overhead of a tool's processor.

One or more configuration files will be stored, typically on data collection processing unit 111, for comparison with parsed information received from sniffed data packets. This process will be described in more detail with respect to FIGS. 3 and 4 below. The configuration files may include information such as CPU IP addresses, module numbers associated with the IP addresses, remote procedure call (RPC) data lengths, and so on.

The WAN 115 is shown electrically coupled to the data collection processing unit 111. However, as one skilled in the art would understand, the WAN 115 may alternatively be electrically coupled to other elements, such as, for example, to the LAN 101. Additionally, the WAN 115 may be within or extend past the confines of the fab environment 100.

Data collected from both the tool SECS interface 103A-n and the tool LAN interface 107A-n may then be merged, correlated, and/or be made available for additional analysis, display, or storage. The collected data may also be made available to a larger network (e.g., the WAN 115) or multiple clients or hosts. Data may be stored on one or more databases (potentially running under multiple operating systems), displayed in a summary format to a user's display, set up as a web page so data may be displayed, accessed, and used worldwide, or otherwise accessed or analyzed.

Figure 2:
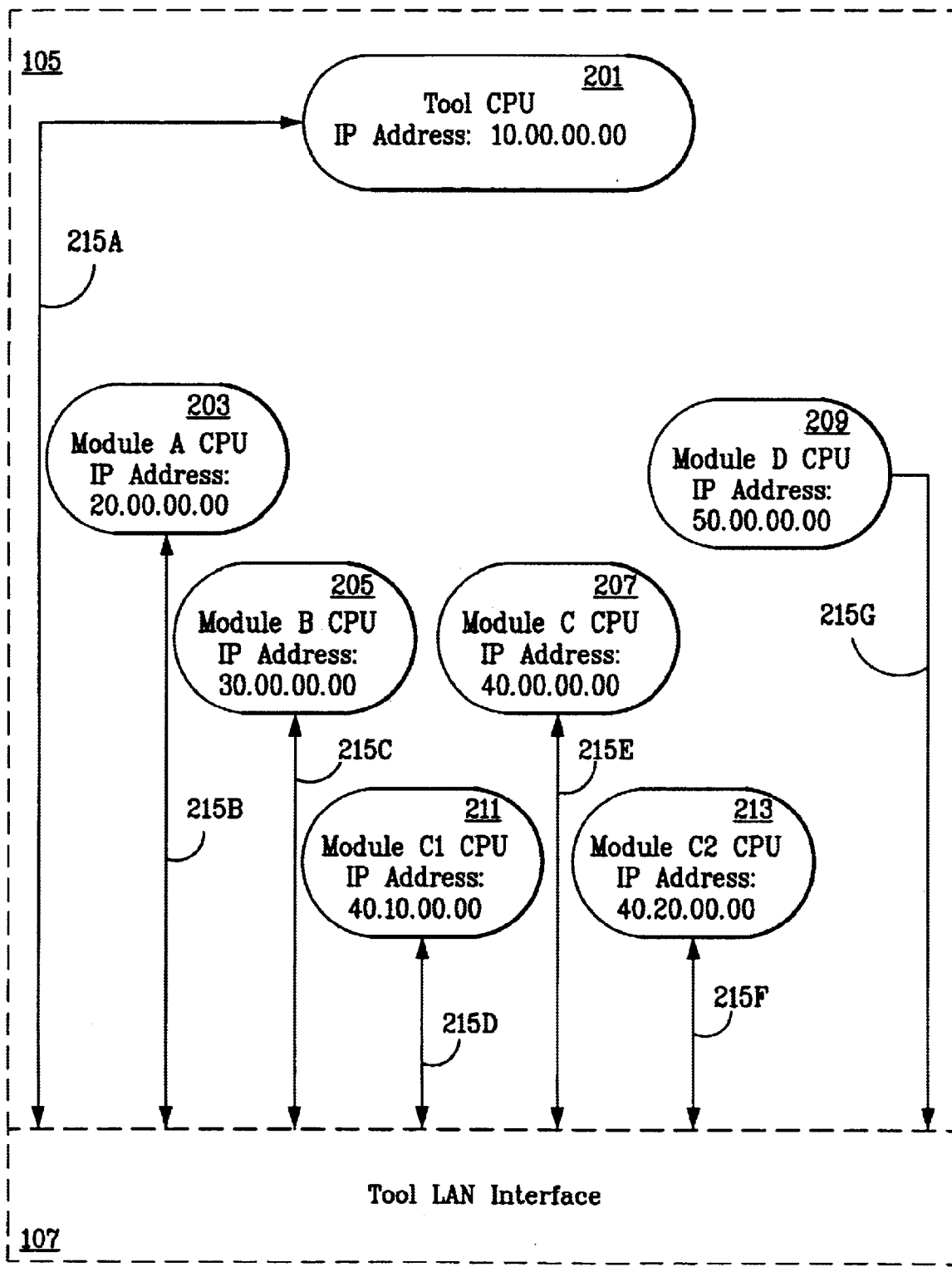
FIG. 2 is an exemplary configuration of central processing units (CPU's) and modules within a tool showing coupling between the CPU's and the LAN interface.

FIG. 2 is an exemplary internal schematic of one of the fab tools 105A-n showing various modules and CPUs. As shown, each of the CPUs 201–213 interface with the tool LAN interface 107 through LAN communications links 215A–G. Each of the CPUs 201–213 may be associated with a particular module of a multi-module cluster tool or, alternatively, multiple CPUs may be required for a single module of the fab tool 105. For example, the CPU 207 associated with a module C of the fab tool 105 has two associated CPUs, a module C1 CPU 211 and a module C2 CPU 213. For purposes of the present discussion, individual modules of a cluster tool may be viewed as the equivalent of individual tools.

Each of the module CPUs may also be interfaced directly to the tool SECS interface (not shown) or, alternatively, each of the module CPUs 203–213 may be interfaced to the tool SECS interface indirectly through the tool CPU 201. However, notice that the tool CPU 201 and each of the module CPUs 203–213 have their own IP addresses for direct connection to the tool LAN interface 107. The tool CPU 201 communicates with the module CPUs 203–213, just as one tool communicates with another tool, via remote procedure calls (RPC) across the LAN 101. RPCs provide a means for electronically communicating over the LAN 101 network.

In one exemplary embodiment, when the data collection process is operative, the data collection processing unit 111 places a call to a packet capture routine to begin packet sniffing (e.g., sniffing of an Ethernet packet), for example, in a continuous mode. Each time a sniffed packet is received from the LAN 101, checks and tests are conducted to verify if the sniffed data packet is a valid data packet. These checks and tests may be hardware, firmware, or software based and are described in more detail in conjunction with FIG. 4 below.

Figure 3:
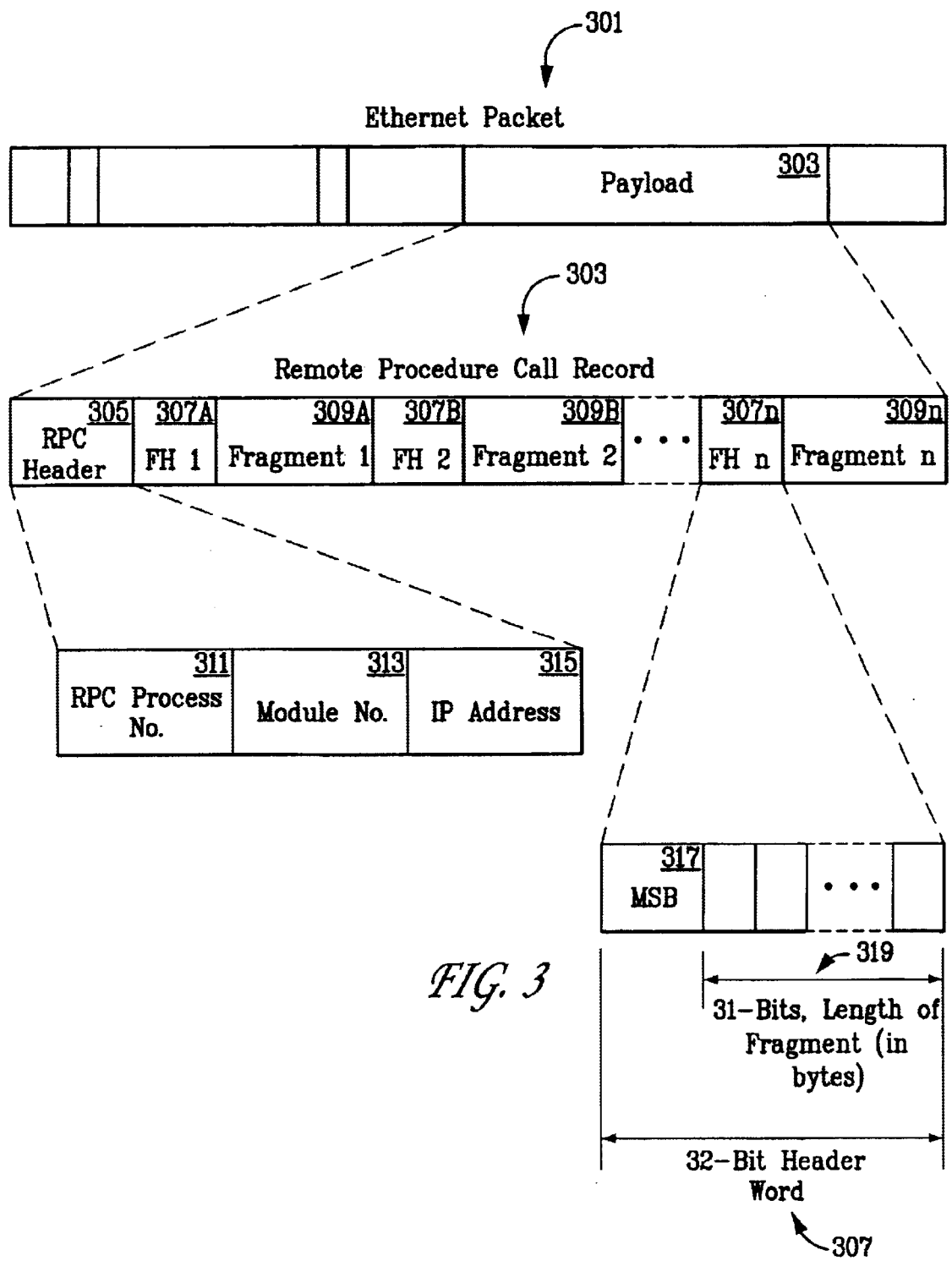
FIG. 3 is a diagram showing an exemplary embodiment of an Ethernet packet containing data from tools.

FIG. 3 is an exemplary embodiment showing a protocol of how data fragments are contained within an Ethernet packet 301. A structure of the Ethernet packet 301 is well defined and contains various elements, such as a preamble, a start frame delimiter, source and destination addresses, etc. Data from the fab tool 105A-$n$ is contained within a payload section 303 of the Ethernet packet 301. In one embodiment of the present invention, the payload section 303 is a record of a remote procedure call (RPC). The RPC record 303 is comprised of an RPC header 305, and one or more data fragments 309A-$n$. Each of the data fragments 309A-$n$ is preceded by a data fragment header 307A-$n$. The RPC header 305 includes an RPC process number 315, a module number 317, and an IP address 315. Each data fragment header 307A-$n$ is a 32-bit header word. The 32-bit header word 307 is further divided into a most-significant bit (MSB) 317 and a 31-bit section 319. If the data fragment 309$n$ is the last data fragment in the payload section 303, the MSB 317 will be set high. The 31-bit section 319 indicates the length of the fragment 307A-$n$ that follows (in bytes).

Figure 4:
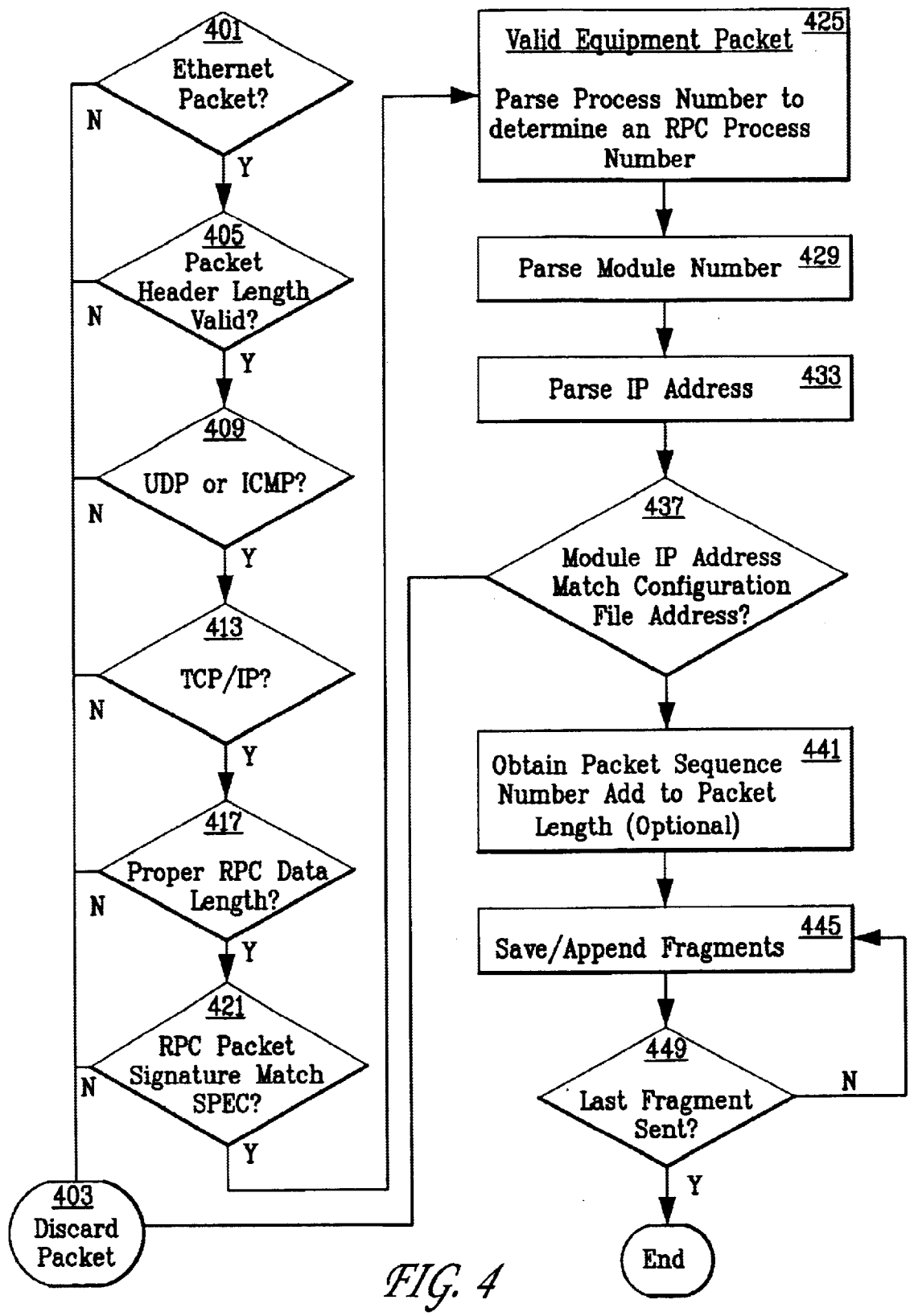
FIG. 4 is a flowchart of an exemplary method for validating and parsing electronically collected data.

FIG. 4 is a flowchart of an exemplary method for verifying valid data packets and extracting, or parsing, the data fragments 309A-$n$ from the valid data packets. Typically, the exemplary method will be implemented in a software program, although one skilled in the art can envision a hardware implementation of the method as well. Additionally, one skilled in the art will also realize that many of the steps may be performed in an order different than is shown herein but an end-result will still be the same. Therefore, the exemplary method set forth below is by means of example only.

Initially, the software program determines 401 whether a sniffed packet is an Ethernet packet. Since the structure of the Ethernet packet 301 is well defined (e.g., a preamble, a start frame delimiter, source and destination addresses, etc.), the software can readily determine 401 if the sniffed packet is an Ethernet packet. If the sniffed packet is not an Ethernet packet, the sniffed packet is discarded 403.

If the sniffed packet is an Ethernet packet, the software next determines 405 if a header length of the sniffed packet is valid based on a valid Ethernet header length. If the header length is not valid, the sniffed packet will be discarded 403.

If the header length of the sniffed packet is valid, the software determines 409 whether the sniffed packet follows a user datagram protocol (UDP) or an internet control message protocol (ICMP). If the sniffed data packet follows either a UDP or ICMP protocol, the sniffed packet is discarded 403.

If the sniffed packet does not follow either a UDP or an ICMP protocol, the software determines 413 whether the sniffed packet follows a transmission control protocol/internet protocol (TCP/IP). If the sniffed packet does not follow the TCP/IP protocol, the sniffed packet is discarded 403.

If the sniffed packet follows a TCP/IP protocol, the software determines 417 whether a remote procedure call (RPC) data length of the sniffed packet is equal to an RPC data length specification saved in the data collection processing unit 111 as part of the configuration file for the fab tools 105A-$n$ (FIG. 1). If the RPC data length of the sniffed packet does not meet the specification data length, the sniffed packet is discarded 403.

If the RPC data length of the sniffed packet is equal to the RPC data length specification saved in the data collection processing unit 111, the software determines 421 whether an RPC packet signature matches an RPC packet signature specification saved as part of the configuration file for the fab tools 105A-$n$ (FIG. 1). If the RPC packet signature of the sniffed packet does not meet the RPC packet signature specification, the sniffed packet is discarded 403.

At this point in the process, if the RPC packet data length of the sniffed packet is equal to the RPC data length specification, the sniffed packet contains one or more data fragments 309A-$n$ (i.e., the sniffed data packets are valid data packets).

An RPC process number 311 from the sniffed packet is then parsed 425 to determine what type of data is contained in the payload section 303 of the Ethernet packet 301 (FIG. 3). For example, the payload section 303 may contain either a full data refresh or a delta data refresh from the fab tool 105A-$n$. A full data refresh indicates that all RPC records of a fab tool or module are updated with each of the payload sections 303 sent. A delta data refresh will only update records that have changed since the fab tool 105A-$n$ sent the previous RPC record. One or more of the CPU's 201–213 (FIG. 2) associated with the fab tool 105A-$n$ dictates whether a full data or delta data refresh record is sent.

A module number and an IP address is then parsed 429, 433 to determine from which CPU 201–213 a sniffed packet originated. The module number and the IP address will then be compared 437 with the configuration file saved in the data collection processing unit 111 to determine if the module number and the IP address are both valid numbers. If one or both of the numbers do not match the configuration file, the valid equipment packet is discarded 403.

Optionally, if the module number and the IP address both match the configuration file, then a packet sequence number is obtained 441. If more than one packet sequence exists, the packet sequence is added to the packet length in step 441. One example of a packet sequence number is a value of a system timestamp added to a data length of a current data fragment 309A-$n$. By providing a sequence number that is equal to a summation of the system timestamp and the length of the current data fragment 309A-$n$, then each data fragment 309A-$n$ has a unique sequence number.

One or more data fragments 309A-$n$ is then saved 445, for example, into a data buffer. If one or more data fragments 309A-$n$ have already been saved, then any additional data fragments are appended to existing fragments in a sequential order based on the sequence number. Additionally, FIGS. 5A and 5B give examples of the types of data contained in the data fragments 309A-n and how these data may be merged with SECS data.

A check 449 is then performed to determine whether the last data fragment 309n has been received. The last data fragment is indicated by the MSB 317 being high in the last data fragment header 307n (FIG. 3). If the last data fragment 309n has not been received, then the save/append fragment step 445 is repeated until the last data fragment 309n is received.

Once the last data fragment 307n is received, the saved/appended data fragments from step 445 may be saved to a storage device (e.g., a disk drive, not shown) for further retrieval or analysis. Data analysis will be discussed further in conjunction with FIGS. 5A and 5B below.

FIG. 5A is an exemplary tabular listing 501 of process data available from the processing unit SECS interface 109 (FIG. 1) and sniffed from the LAN 101. The first column is an example of SECS data 503 output by a process tool. The SECS data 503 provides basic process information and a listing of various modules on the process tool. More complete process data is available in the second column, which shows an example of parsed, sniffed data 505 collected from the process tool. The parsed, sniffed data 505 provides information beyond the basic SECS data 503 detailing each of the module recipes being run at a given point in time as well as several process parameters such as module chamber pressures, temperatures, and process times. The exemplary tabular listing 501 may then be saved to, for example, a fab-wide file server (not shown) for later retrieval and analysis. The fab-wide file server may, in itself, be coupled to larger network, such as the WAN 115. Additionally, the SECS data 503 and the parsed, sniffed data 505 may each be saved in separate files and later merged as described in conjunction with FIG. 5B below. Optionally, the SECS data 503 and the parsed, sniffed data 505 may be merged and then saved in a merged file.

FIG. 5B is an exemplary merged tabular listing 507 of the merged SECS data 503 and the parsed, sniffed data 505. The merged tabular listing 507 is an example of a unified record formed by combining data available from the tool SECS interface 103A-n and the tool LAN interface 107A-n. One skilled in the art will recognize that this data may readily be merged anywhere in the process flow of the present invention and the point where these data are merged should not limit the scope of the present invention.

The present invention has been described above with reference to specific embodiments. It will be apparent to one skilled in the art that various modifications may be made and other embodiments can be used without departing from the broader scope of the present invention. For example, although the present invention has been exemplarily described in terms of one or more process tools, it would be obvious to one skilled in the art to modify the present invention for use with any type of production, metrology, or R&D tool.

What is claimed is:

1. A system for electronically collecting data in a process line of a semiconductor or data storage fabrication facility, comprising:

a data collection processing unit, the data collection processing unit coupled to a plurality of tools within the fabrication facility through a SECS interface, the SECS interface configured to receive general process data from the plurality of tools;

the data collection processing unit being further coupled to a LAN, the data collection processing unit configured to sniff data packets transmitted over the LAN between the plurality of tools coupled to the LAN;

the data collection processing unit being further configured to determine if the sniffed data packets are valid data packets based on a configuration file established for the plurality of tools; and the data collection processing unit being further configured to parse one or more data fragments from the valid data packets.

2. The system of claim 1 further comprising a data storage configured to store the one or more data fragments and the general process data into one or more data files.

3. The system of claim 2 wherein the data storage is coupled to a larger network.

4. The system of claim 1 wherein the data collection processing unit is further configured to merge the general process data and the valid data packets to form a unified record.

5. A method for electronically collecting data in a process line of a semiconductor or data storage fabrication facility, comprising:

collecting general process data through a SECS interface from a plurality of tools within the fabrication facility;

sniffing data packets transmitted over a LAN by the plurality of tools;

determining if the sniffed data packets are valid data packets; and parsing one or more data fragments from the valid data packets.

6. The method of claim 5 further comprising storing the general process data and the data fragments into one or more data files.

7. The method of claim 6 further comprising analyzing the stored general process data and the stored data fragments.

8. The method of claim 5 further comprising merging the general process data and the data fragments to form a unified record.

9. The method of claim 5 wherein the step of parsing one or more data fragments further comprises:

parsing a process number;

parsing a module number;

parsing a module IP address; and verifying whether the module IP address matches an address in a stored configuration file.

10. The method of claim 5 wherein the step of determining if the sniffed data packets are valid data packets further comprises:

checking the sniffed data packet for a proper Ethernet header length;

checking if the sniffed data packet is TCP/IP; and verifying whether a signature of the sniffed data packet matches a specification stored in a configuration file.

11. A computer readable medium having embodied thereon a computer program, the computer program being executable by a machine to perform method steps for collecting data in a process line of a semiconductor or data storage fabrication facility, the method comprising:

collecting general process data through a SECS interface from a plurality of tools within the fabrication facility;

sniffing data packets transmitted over a LAN by the plurality of tools;

determining if the sniffed data packets are valid data packets;

parsing one or more data fragments from the valid data packets; and storing the data fragments and the general process data into one or more data files.

12. The computer readable medium of claim 11 further comprising the step of analyzing the stored general process data and the stored data fragments.

13. The computer readable medium of claim 11 further comprising the step of merging the general process data and the data fragments to form a unified record.

14. The computer readable medium of claim 11 wherein the step of parsing one or more data fragments further comprises:

parsing a process number;

parsing a module number;

parsing a module IP address; and verifying whether the module IP address matches an address in a stored configuration file.

15. The computer readable medium of claim 11 wherein the step of determining if the sniffed data packets are valid data packets further comprises:

checking the sniffed data packet for a proper Ethernet header length;

checking if the sniffed data packet is TCP/IP; and verifying whether a signature of the sniffed data packet matches a specification stored in a configuration file.

16. A method for validating and parsing electronically collected data in a process line of a semiconductor or data storage fabrication facility, comprising:

sniffing data packets transmitted over a LAN by a plurality of tools within the fabrication facility;

determining if the sniffed data packets are valid data packets by checking the sniffed data packets for a proper Ethernet header length, checking if the sniffed data packets are TCP/IP, and verifying whether a signature of the sniffed data packets match a specification stored in a configuration file;

parsing one or more data fragments from the valid data packets by parsing a process number, parsing a module number, parsing a module IP address, and verifying whether the module IP address matches a configuration file address; and storing the data fragments and the general process data into one or more data files.

17. The method of claim 16 further comprising analyzing the stored general process data and the stored data fragments.

18. The method of claim 16 further comprising merging the general process data and the data fragments to form a unified record.

19. A system for electronically collecting data in a process line of a semiconductor or data storage fabrication facility, comprising:

a means for collecting process data, the data collection means coupled to a plurality of tools within the fabrication facility through a SECS interface, the SECS interface configured to receive general process data from the plurality of tools;

the data collection means being further coupled to a LAN, the data collection means configured to sniff data packets transmitted over the LAN between the plurality of tools coupled to the LAN;

the data collection means being further configured to determine if the sniffed data packets are valid data packets based on a configuration file established for the plurality of tools;

the data collection means being further configured to parse one or more data fragments from the valid data packets; and a means for storing data configured to store the one or more data fragments and the general process data into one or more data files.

20. The system of claim 19 wherein the means for storing data is coupled to a larger network.

21. The system of claim 19 wherein the general process data and the valid data packets are merged to form a unified record.

22. A system for electronically collecting data in a process line of a semiconductor or data storage fabrication facility, comprising:

a data collection processing unit configured to sniff data packets transmitted over a LAN between a plurality of tools located in the fabrication facility and coupled to the LAN;

the data collection processing unit being further configured to determine if the sniffed data packets are valid data packets based on a configuration file established for the plurality of tools; and the data collection processing unit being further configured to parse one or more data fragments from the valid data packets.

23. The system of claim 22, further comprising a data storage configured to store the one or more data fragments into one or more data files.

24. The system of claim 23 wherein the data storage is coupled to a larger network.

25. A method for electronically collecting data in a process line of a semiconductor or data storage fabrication facility, comprising:

sniffing data packets transmitted over a LAN by a plurality of tools located in the fabrication facility;

determining if the sniffed data packets are valid data packets; and parsing one or more data fragments from the valid data packets.

26. The method of claim 25 further comprising storing the data fragments into one or more data files.

27. The method of claim 26 further comprising analyzing the stored data fragments.

28. The method of claim 25 wherein the step of parsing one or more data fragments further comprises:

parsing a process number;

parsing a module number;

parsing a module IP address; and verifying whether the module IP address matches an address in a stored configuration file.

29. The method of claim 25 wherein the step of determining if the sniffed data packets are valid data packets further comprises:

checking the sniffed data packet for a proper Ethernet header length;

checking if the sniffed data packet is TCP/IP; and verifying whether a signature of the sniffed data packet matches a specification stored in a configuration file.

* * * * *